United States Patent [19]
Webster et al.

[11] Patent Number: 5,425,052
[45] Date of Patent: Jun. 13, 1995

[54] HIGH IMPEDANCE DIRECTIONAL SIGNAL SEPARATOR FOR EXTRACTING AND SEPARATING RESPECTIVE SIGNALLING COMPONENTS OF A WIRELINE FULL-DUPLEX DIGITAL DATA LINK

[75] Inventors: Mark A. Webster; Richard D. Roberts, both of Palm Bay; Keith R. Baldwin, Melbourne Beach, all of Fla.

[73] Assignee: Harris Corporation, Melbourne, Fla.

[21] Appl. No.: 930,728

[22] Filed: Aug. 14, 1992

[51] Int. Cl.⁶ .............................................. H04B 3/46
[52] U.S. Cl. .................................... 375/224; 375/220; 375/257; 370/13; 333/112
[58] Field of Search ................. 375/7, 10, 36; 370/13, 370/17, 25, 28, 30; 333/17.3, 109, 111, 112, 115

[56] References Cited

U.S. PATENT DOCUMENTS

| | | | |
|---|---|---|---|
| 3,828,281 | 8/1974 | Chambers, Jr. | 333/17.3 |
| 3,934,213 | 1/1976 | Stuckert | 333/112 |
| 4,034,289 | 7/1977 | Rozylowicz et al. | 333/115 |
| 4,860,309 | 8/1989 | Costello | 375/36 |
| 5,140,172 | 8/1992 | Flack | 375/36 |

*Primary Examiner*—Stephen Chin
*Assistant Examiner*—Young Tse
*Attorney, Agent, or Firm*—Charles E. Wands

[57] ABSTRACT

A wireline bridge tap device and an associated signal processing mechanism are capable of successfully extracting and recovering the respective signalling components of a full-duplex wireline digital data link without having to disturb the link during its use (e.g. as by interrupting service to sever the link in order to install a line coupling device, such as a modem or attenuator pad to signal monitoring equipment). The full-duplex wireline bridge device comprises a signal characteristic monitoring device that is capable of monitoring the link and providing respective output signals representative of the respective unidirectional signal components being transmitted simultaneously in opposite directions along the link. A directional signal separator, comprised of a voltage probe and a current probe, each of which can be coupled to the link without severing the link or otherwise disrupting ongoing communications, couples the signal characteristic monitoring device to the link. The signal processing device is operative to controllably combine the outputs of the voltage and current probes and provides respective output signals that are representative of the desired unidirectional signal components. The communications link may be either a single wire transmission line or a two wire balanced transmission line. In the latter instance individual probes of pairs of voltage and current probes are coupled to respective portions of the two wire balanced transmission line.

12 Claims, 11 Drawing Sheets

$$M(f) = M_t(f) \, M_c(f)$$

EACH FILTER REPRESENTED BY A FIR FILTER

HIGH IMPEDANCE DIRECTIONAL SIGNAL SEPARATOR FOR EXTRACTING AND SEPARATING RESPECTIVE SIGNALLING COMPONENTS OF A WIRELINE FULL-DUPLEX DIGITAL DATA LINK

FIELD OF THE INVENTION

The present invention relates to communication systems and is particularly directed to a wireline monitoring device and an associated signal processing mechanism that is capable of successfully extracting and recovering the respective signalling components of a full-duplex wireline digital data link.

BACKGROUND OF THE INVENTION

Full-duplex communication links, a diagrammatic illustration of an individual one of which is shown in FIG. 1, are commonly employed in a wide variety of communication systems. In a digital communication system the format of the signal being conveyed over the link is typically an analog waveform the level of which conveys digital logic level information to the link users in some methodical manner. On occasion, as in the case of a routine maintenance operation, it may be necessary to couple signal measuring equipment to the link. If, for example, a signal monitoring device, such as an oscilloscope, is coupled to link 13 while only user A is transmitting, then the data waveform for user A would be observed on the scope display screen. Likewise, if only user B was transmitting, then the observed waveform would be that belonging to user B.

Because a full-duplex data link is one in which dual direction digital communications take place simultaneously between a user A at a 'west' station 11 and a user B at an 'east' station 12 at the opposite end of a link 13, then whatever device is used to monitor the signals must be able to both intercept the two signals and separate them from one another. Once the two signals are separated, they can be processed (via a demodulator) to recover the digital information conveyed from user A and/or user B.

Operationally, each user is able to recover the other's data through waveform separation resulting from an a priori knowledge of the transmitted waveform. Techniques used to accomplish this include transformer hybrids and digital echo cancellation. (It is assumed that the demodulators contain the necessary signal processing hardware and employ appropriate signal processing techniques to compensate for any distortion present in the separated signals due to the two wire transmission line.) In the case of merely coupling an oscilloscope to the link, when both user A and B are transmitting, the observed waveform on the link is the composite waveform for A and B, so that the two signals interfere with each other in such a manner that, in general, it is not possible to distinguish the signal transmitted from either user A or user B.

Historically, this inability to distinguish between the two signals has involved the insertion of some form of device directly into the link, as diagrammatically illustrated in FIG. 2. Unfortunately, such an installation first requires that the line be cut and that termination devices, such as respective type A and type B modems 21 and 22 diagrammatically illustrated in FIG. 3, be physically installed, thereby disrupting the ongoing communications between users A and B. Moreover, a power failure in such cascaded back-to-back modem equipment would interrupt link service.

Another technique comprises establishing an amplitude difference between the two signals Sa and Sb, by installing an attenuator in the line and measuring the amplitude of the signal on one side of the attenuator versus the signal level on the other side of the attenuator. Using this signal level information, user A's signal can be separated from user B's signal. Again, however, this scheme requires cutting the wire and installing the attenuator. Moreover, the permanent insertion of the attenuator imparts an addition loss that can degrade communications between users A and B.

A further approach involves sampling the wireline signals at two spaced apart locations along the link in order to establish a phase or amplitude difference between the sampled signals and thereby differentiate between signals Sa and Sb. However, due to the speed of propagation of the electrical signals on the link with respect to the data rate of the digital data, the separation distance between the two different tap points would have to be hundreds of feet, so that such a technique is not a practical solution to the problem.

SUMMARY OF THE INVENTION

In accordance with the present invention the above-enumerated drawbacks of conventional link monitoring techniques are effectively obviated by means of a wireline bridge tap device and an associated signal processing mechanism that is capable of successfully extracting and recovering the respective signalling components of a full-duplex wireline digital data link without having to disturb the link during its use (e.g. as by interrupting service to sever the link in order to install a line coupling device, such as a modem or attenuator pad to signal monitoring equipment).

The full-duplex wireline bridge device of the invention comprises a signal characteristic monitoring device that is capable of monitoring the link and providing respective output signals representative of the respective unidirectional signal components being transmitted simultaneously in opposite directions along the link. A directional signal separator, comprised of a voltage probe and a current probe, each of which can be coupled to the link without severing the link or otherwise disrupting ongoing communications, couples the signal characteristic monitoring device to the link. The signal processing device is operative to controllably combine the outputs of the voltage and current probes and provides respective output signals that are representative of the desired unidirectional signal components.

The communications link may be either a single wire transmission line or a two wire balanced transmission line. In the latter instance individual probes of pairs of voltage and current probes are coupled to respective portions of the two wire balanced transmission line. A first differential amplifier is coupled to the outputs of the voltage probes and a second differential amplifier is coupled to the outputs of the current probes. The differential amplifiers extract the differential mode signal and reject the common mode signal.

The signal characteristic monitoring device employs a signal processing mechanism which adjusts the characteristic impedance of the interface so as to compensate for the impedance characteristics of the communication link. It also provides compensation for prescribed performance characteristics of the directional signal separator.

DETAILED DESCRIPTION

Figure 1:
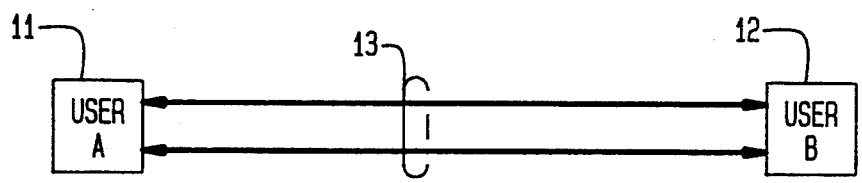
FIG. 1 is a diagrammatic illustration of full-duplex communication link.
Figure 2:
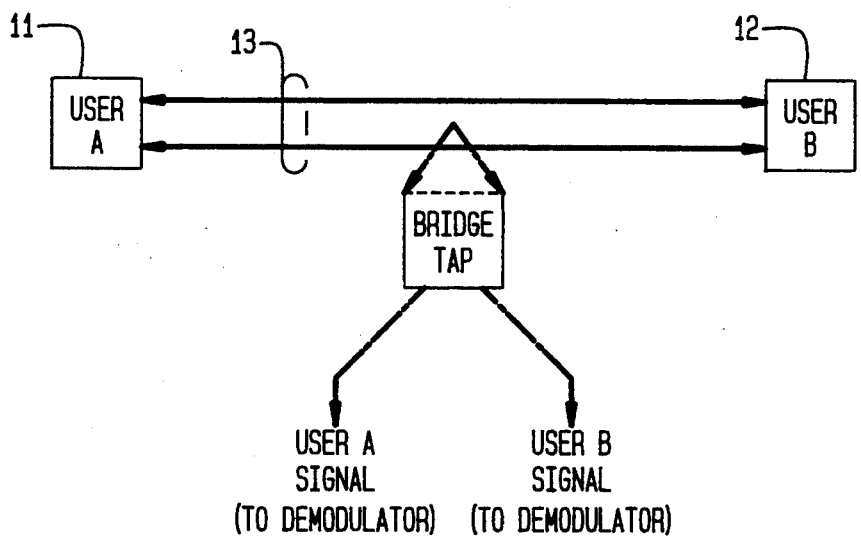
FIG. 2 diagrammatically illustrates the installation of a bridge tap into a communication link for intercepting bidirectional signals being transmitted over the link.
Figure 3:
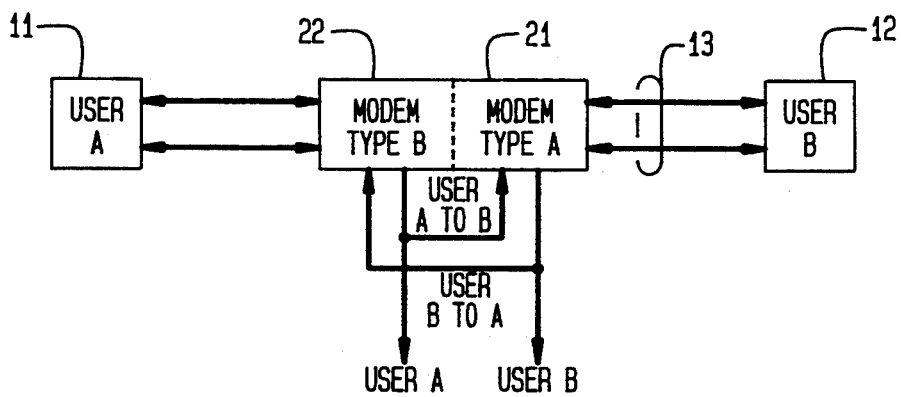
FIG. 3 diagrammatically illustrates the installation of modem devices for intercepting bidirectional signals transmitted over the link.
Figure 4:
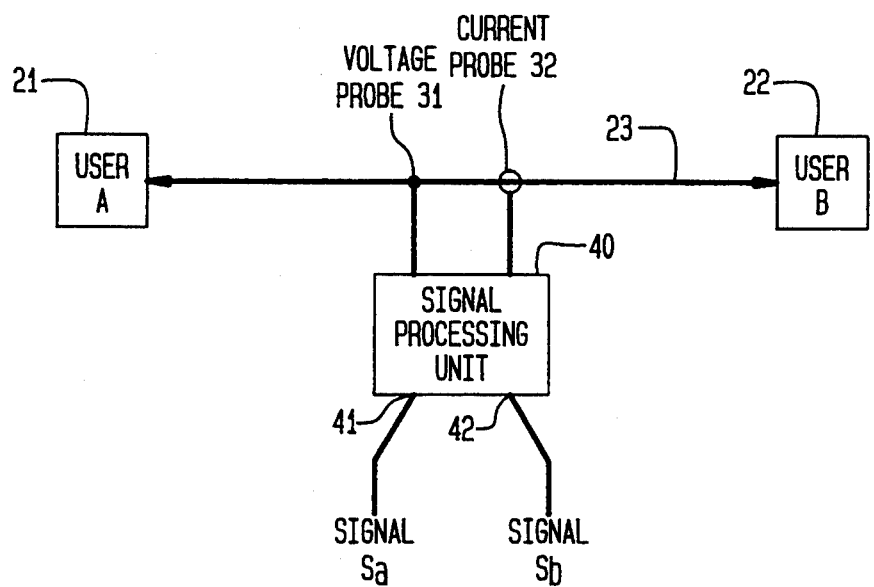
FIG. 4 diagrammatically illustrates a full-duplex digital communication link for effecting digital communications simultaneously between a user A at a 'west' station and a user B at an 'east' station, with a complementary sensor probe pair for sensing respective voltage and current components of signals carried on the link.

FIG. 4 diagrammatically illustrates a full-duplex digital communication link 23 for effecting digital communications simultaneously between a user A at a 'west' station 21 and a user B at an 'east' station 22, with a complementary sensor device pair 31, 32 for sensing respective voltage and current characteristics of the line coupled to a signal processing unit 40, from output ports 41, 42 of which respective signals Sa and Sb are derived in accordance with the present invention. In order to facilitate an understanding of the electrical functionality and the operational parameters of the present invention, it will be initially assumed that communication link 23 is an ideal transmission line with a constant impedance and infinite bandwidth. It will also be assumed that each of voltage probe 31 and current probe 32 is ideal, that is, voltage probe 31 has infinite bandwidth and infinite input impedance; likewise current probe 32 has infinite bandwidth and is linearly responsive to the presence of any current flowing in the line. It will also be assumed that link 23 is a single wire; subsequent description will address the case of a two wire communications link.

Figure 5:
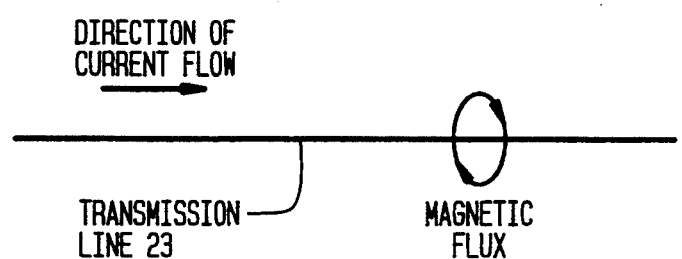
FIG. 5 diagrammatically illustrates the application of the left hand rule for a magnetic field surrounding the wire of a communication link.

Because any current flow in the transmission line gives rise to a magnetic field surrounding the wire expressed as the magnetic flux density, monitoring the current flowing through the transmission line wire gives an indication as to which direction the current is propagating through the line, with the direction of the flux at any point about the wire given by the left hand rule, as diagrammatically shown in FIG. 5. This direction of the magnetic flux is important because reversing the flow of current in the wire reverses the direction of the flux. Thus, it is only necessary to monitor the direction of the flux to determine in which direction the current is flowing.

The total magnetic flux passing through any surface surrounding the wire—specifically a toroid-configured coil of wire employed by a commercially available 'clip-on' current probe sensor—gives rise to an induced voltage. For a coil of wire, the induced voltage V is given by:

$$V = -L\frac{dI}{dt}$$

where L is the induction of the coil of wire surrounding the transmission line and I is the current flowing in the transmission line. It will be observed that if the relative current flow in the transmission line wire reverses direction then the polarity of V reverses sign.

Figure 6:
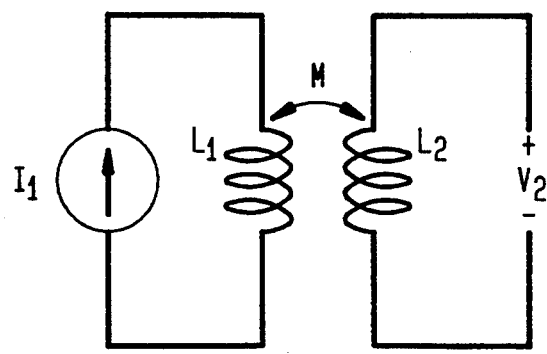
FIG. 6 is an equivalent circuit diagram of a clip-on coil of a commercially available current probe.

The clip-on coil of a commercially available current probe may be modeled by a transformer, an equivalent circuit diagram of which is shown in FIG. 6. The coil/transformer has a mutual inductance M which is the inductance that represents the mutual effect of two coils L1, L2 that share the same magnetic flux field.

The voltage $V_2 = MdI_1/dt$ represents the contribution of current probe 32 to the directional coupler operation. The coefficient of coupling K represents both how efficiently the magnetic flux is coupling between the two coils L1 and L2 and how efficiently the current probe is "picking up" the magnetic flux emanating about the transmission line wire. For K=1, all the flux generated by L1 passes through L2; for a K=0, none of the flux generated by L1 passes through L2.

K typically has a value greater than 0.9 for high quality transformers and in general may be expressed as $$K = \frac{M}{\sqrt{(L_1 L_2)}}$$

Although K will not be used explicitly in the following discussion, it can be shown that for K less than 1.0 the response characteristic of the transformer (current probe 32) will have a frequency dependency. That is, the frequency response of the current probe is not flat, so that compensation is required, as will be described.

Figure 7:
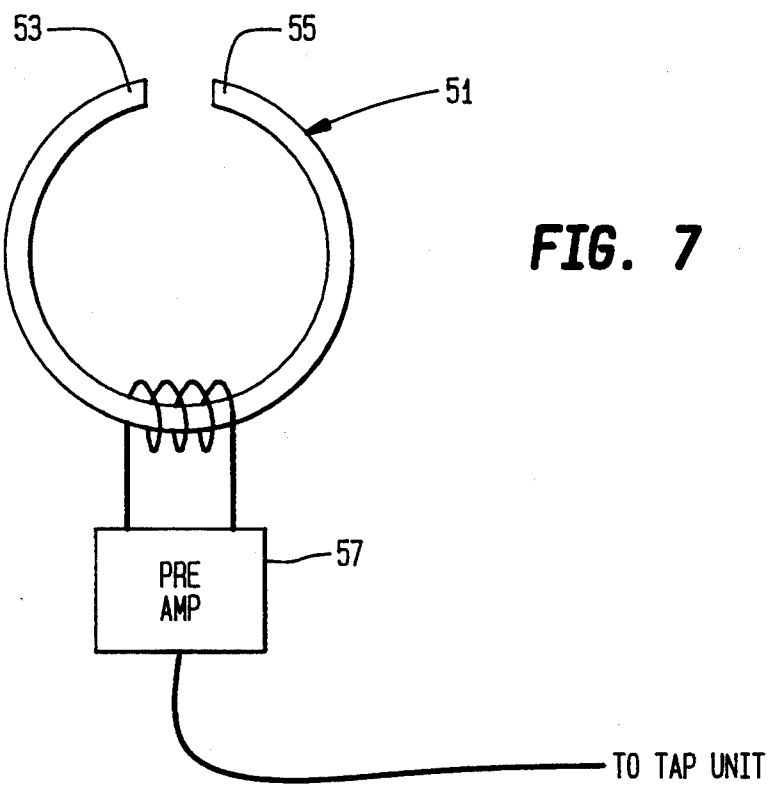
FIG. 7 diagrammatically illustrates a toroidal pickup coil of a commercially available current probe.

As illustrated in FIG. 7, the toroid-configured pickup coil 51 of a commercially available current probe is typically hinged with jaws 53, 55 that open and clamp around the wire to be sensed. The jaws then snap close around the wire without physically penetrating it. Often there is a "pre-amplifier" unit 57 that is associated with the probe and is considered to be part of the current probe device. Voltage probe 31 is preferably a commercially available, high impedance, wide bandwidth oscilloscope probe, which commonly contains a spring loaded hook device at its distal end to make a mechanical connection to a metallic conductor. While this means that a portion of the insulation on the transmission link wire will have to be removed, the wire does not have to be physically cut. Since the probe contains a small amount of internal shunt capacitance, it also exhibits a frequency dependency in its response. As the frequency increases, this shunt capacitance causes the upper frequency response to have more loss than the lower frequency response. Again, as will be described, this non-flat frequency response must be compensated to achieve proper operation of the directional coupler and hence the tap on the transmission line.

With voltage probe 31 clipped on the transmission wire (e.g. zero ohmic contact) and current probe 32 is clipped around the transmission line, the complementary probe device of FIG. 4 provides both a sample of the voltage present on the line and a sample of the current flowing through the line. As will be described, by the proper combination of these voltage and current samples we can separate the two signals Sa and Sb from users A and B. The signals may be expressed as:

Signal Sa=Gv*Vsample+Gc*Isample

Signal Sb=Gv,Vsample−Gc*Isample where:
Vsample is the voltage sample value,
Gv is a voltage sample gain scaler,
Isample is the current sample value, and
Gc is a current sample gain scaler.

It should be noted that the only difference between the required condition to recover signal Sa instead of signal Sb is a sign reversal in the equations. Circuits which are capable of performing this functionality, namely, are responsive to what direction a signal is propagating, fall under the general category "directional couplers." Placing a directional coupler in an ideal transmission line carrying a full-duplex communications link will allow the recovery of only one of the two signals. By modifying the connections within the directional coupler, the second signal, which is propagating in the opposite direction, may be recovered. To allow both signals to be recovered at the same time, a bi-directional coupler may be employed.

The functionality and mathematical expressions of directional couplers are well known. Examples of conventional directional couplers using coupled transmission lines and/or coupled magnetic circuits (transformers) are described in U.S. Pat. No. 3,426,298, entitled "Broadband Directional Coupler," and in articles by McDonald, entitled "Low Cost, Wide Band Dual Directional Coupler" RF Design, May/June, 1982, and McWhorter, entitled "Broadband RF Transformer Directional Couplers," RF Design, July 1991. None of these conventional implementations employs the combination of a voltage probe and a current probe to effectively perform the functionality of a directional coupler.

Figure 8:
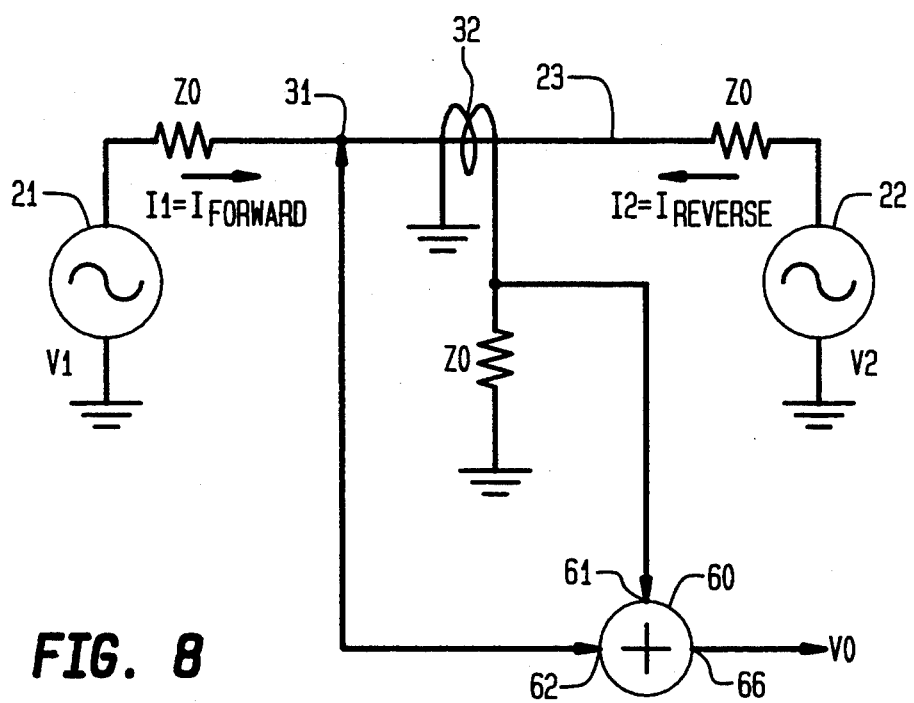
FIG. 8 is a schematic of a directional coupler formed by the interconnection of a current probe and a voltage probe.

FIG. 8 is a schematic of a directional coupler formed by the interconnection of a current probe and a voltage probe. An expression for a directional coupler, assuming an ideal transmission line of characteristic impedance Z0, comprised of voltage and current probes may be derived. (As noted above, a directional coupler is a device that responds to a signal propagating only in one preferred direction.)

The ideal transmission line itself is considered to contain impedances Z0 between the respective west and east ends 11 and 12 of the link and the location whereat the voltage probe 31 and current probe 32 are coupled to the line. Current probe 32 is terminated to ground through the design impedance Z0 of the current probe when performing the directional coupler function and is coupled to one input 61 of a summing circuit 60. Voltage probe 31 is coupled to a second input 62 of summing circuit 60.

The signals of interest in the directional coupler connection of FIG. 8 are Vforward=V1/2, Iforward=V1/(2Z0), Vreverse=V2/2, and Ireverse=V2/(2Z0). The voltage VT and the current IT at the tap point may be defined as VT=Vforward+Vreverse, and IT=Iforward−Ireverse. The directional coupler operates on the quantities VT and IT to separate the forward and reverse propagating waves. The output voltage Vo is given by:

$$Vo = VT + (B)(IT)(Z0) = V1(1+B)/2 + V2(1-B)/2.$$

It can readily be seen that for B=+1, Vo=V1, and for B=−1, Vo=V2. As a consequence, the directional coupler is able to separate the forward and reverse propagating waves. Since the transmission line is assumed to be ideal, it also separates the signal sources on each end of the line. Since the transmission line impedance is assumed to be constant regardless of frequency, the signal sources V1 and V2 are representative of time domain transforms (i.e. digital data information) while being perfectly separated at Vo.

Although the foregoing demonstrates that under ideal conditions a directional coupler can perfectly separate a forward propagating waveform emitting from a source Sa from a reverse propagating waveform emitting from the source Sb. This separation between the sources occurred because the transmission line is ideal. Namely, the line impedance is constant with frequency; hence, the line has no signal reflections on it due to any impedance anomaly.

Figure 9:
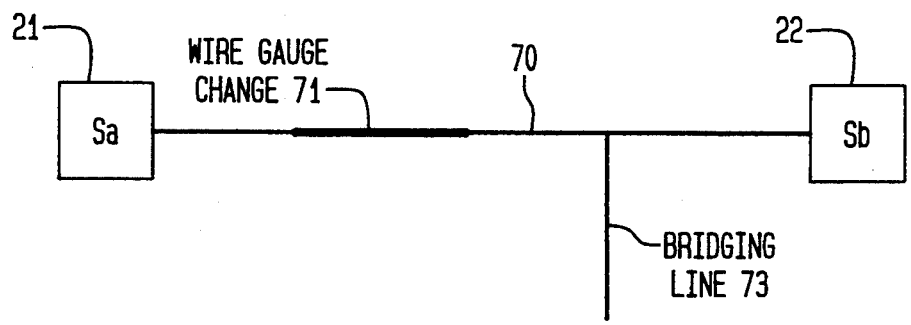
FIG. 9 diagrammatically illustrates an example of a typical wireline transmission line between two sources, having a change in wire gauge and a bridging line which are anomalies causing the characteristic impedance of the transmission line between the sources to be non-constant.

Unfortunately, in a real installation, transmission lines for a wireline data communications link often do not have constant characteristic impedance due to changes in wire gauge, bridging lines, etc. FIG. 9 diagrammatically illustrates an example of a typical wireline transmission line 70 between a source Sa and a source Sb, having a change in wire gauge 71 and a bridging line 73, which are anomalies causing the characteristic impedance of the transmission line 70 between source Sa and source Sb to be non-constant.

Figure 10:
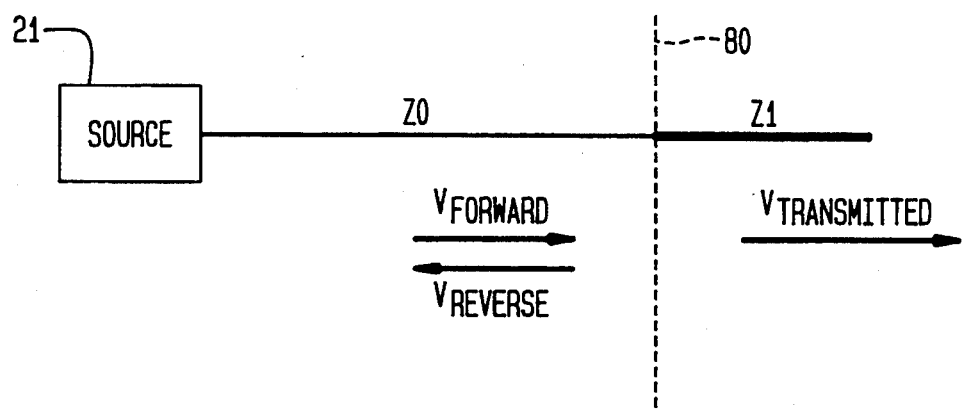
FIG. 10 diagrammatically illustrates an impedance transition at reflection boundary.

It is well known that when a transmission line is not terminated in its characteristic impedance that part of the forward propagating electromagnetic wave is reflected backwards from the impedance transition diagrammatically illustrated at reflection boundary 80 in FIG. 10. The amount of reflection is characterized by the reflection coefficient which may be expressed as:

$$P_1 = (Z1 - Zo)/(Z1 + Zo).$$

Figure 11:
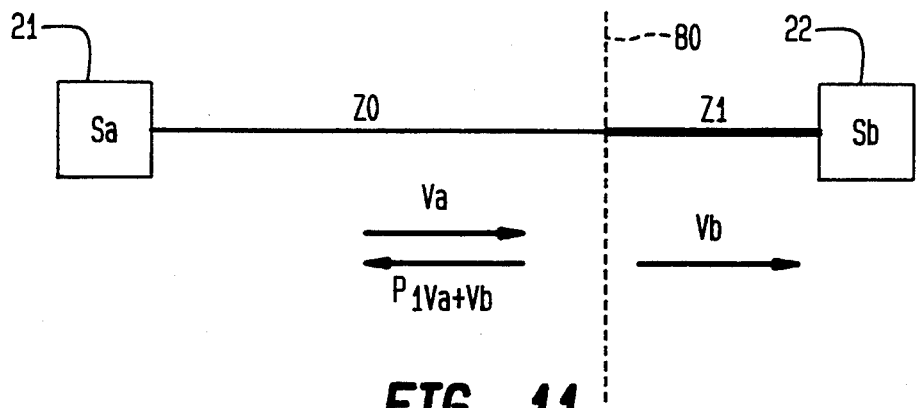
FIG. 11 shows a transmission line for a typical wireline communications link that contains a multitude of impedance anomalies that cause the signals from sources Sa and Sb to appear as additive terms in the forward and reverse propagating waves.

An actual transmission line for a typical wireline communications link contains a multitude of impedance anomalies that cause the signals from sources Sa and Sb to appear as additive terms in the forward and reverse propagating waves. This phenomenon is illustrated in FIG. 11, from which it can be seen that the reverse propagating wave may be expressed as:

$$Vreverse = i\ P_i Va + Vb.$$

Thus, it can be seen that the signals from sources Sa and Sb are intrinsically mixed together.

If a directional coupler with a terminating impedance of Zo is located anywhere along the transmission line of characteristic impedance Zo, the forward and reverse propagating waves may be separated from one another. However, as demonstrated above, signals from sources Sa and Sb are not separated as desired. In order to separate these signals it is necessary to change the terminating impedance of the coupler, to form what may be termed a directional signal separator. Unlike a directional coupler, which can only separate the forward and reverse propagating waves, a directional signal separator compensates for the impedance anomalies of the transmission line and effectively separates the signals from sources Sa and Sb.

Figure 12:
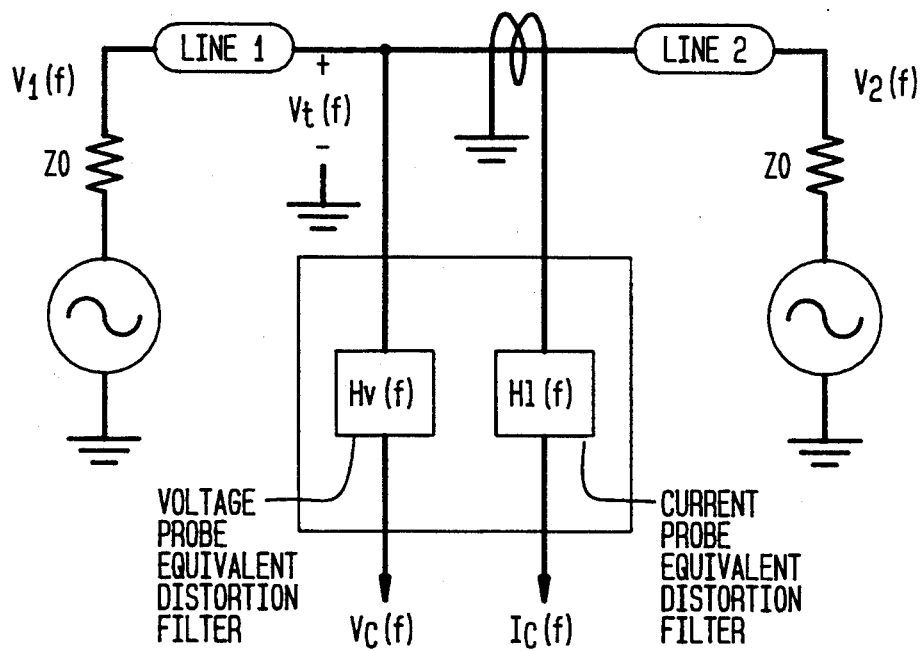
FIG. 12 diagrammatically illustrates a directional coupler circuit model which includes transmission lines together with the distortion of the lines.

More particularly, consider a directional coupler circuit operating at one frequency within a frequency band of interest, which may typically extend from near D.C. up to several hundred kilohertz. The upper frequency limit may be delineated as Fupper. FIG. 12 diagrammatically illustrates a directional coupler circuit model which includes transmission lines together with the distortion of the lines. The distortion due to the voltage and current probes is modelled as distortion filters.

Figure 13:
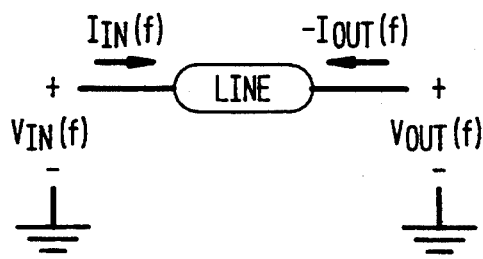
FIG. 13 shows a voltage and current transfer function for circuit model of the effects of the transmission lines.

Within the circuit model the effects of the transmission lines may be defined using the voltage and current transfer function illustrated in FIG. 13 and employing the ABCD matrix representation $$\begin{bmatrix} Vin(f) \\ Iin(f) \end{bmatrix} = \begin{bmatrix} A & B \\ C & D \end{bmatrix} \begin{bmatrix} Vout(f) \\ -Iout(f) \end{bmatrix}$$

Figure 14:
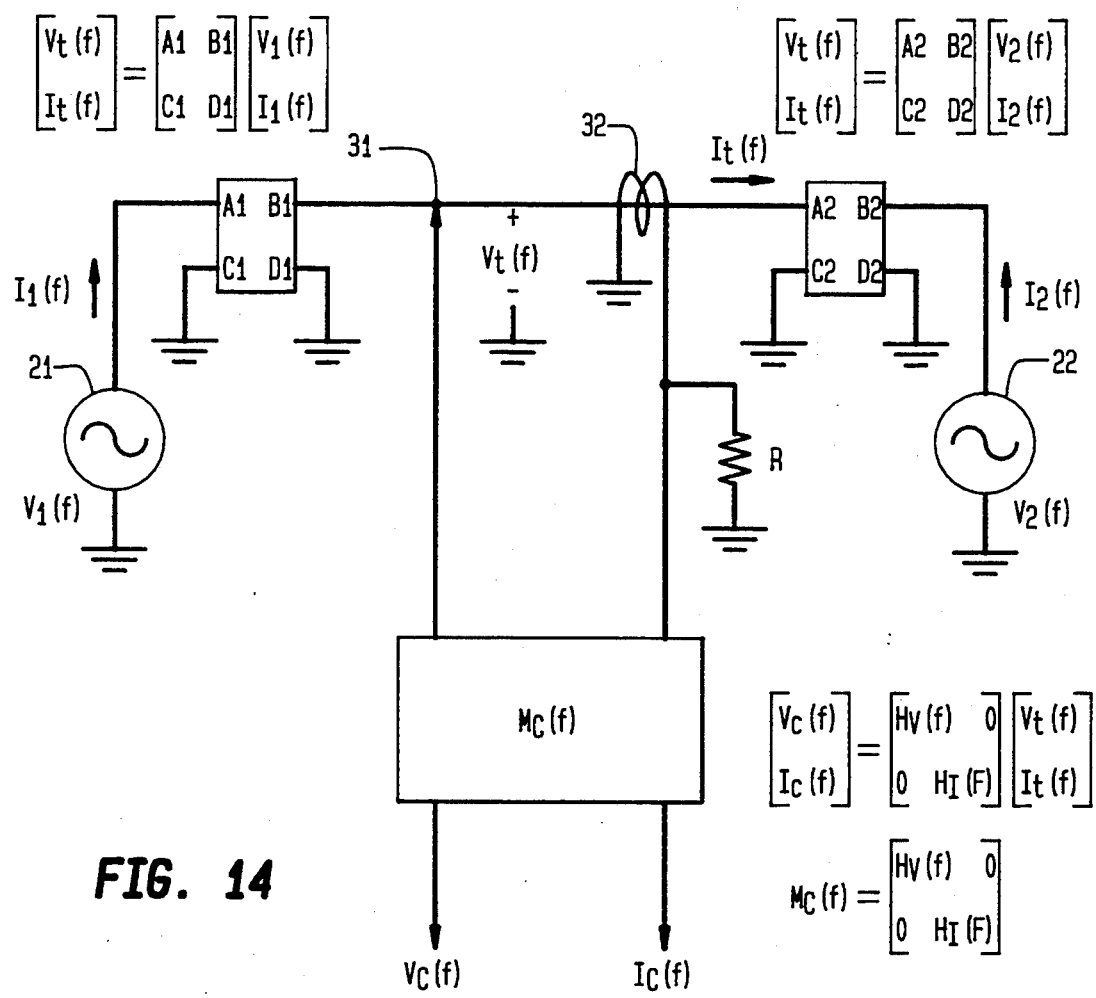
FIG. 14 shows the coupler schematic of FIG. 12 redrawn using the ABCD representation of the transmission lines.

The coupler schematic of FIG. 12 may be redrawn using the ABCD representation of the transmission lines as shown in FIG. 14. In FIG. 14, probe distortion filters are embedded within a matrix Mc(f). It will be observed that the voltage Vt(f) and the current It(f) represent a boundary condition that the ABCD matrices having the subscripts 1 and 2 must both satisfy.

Figure 15:
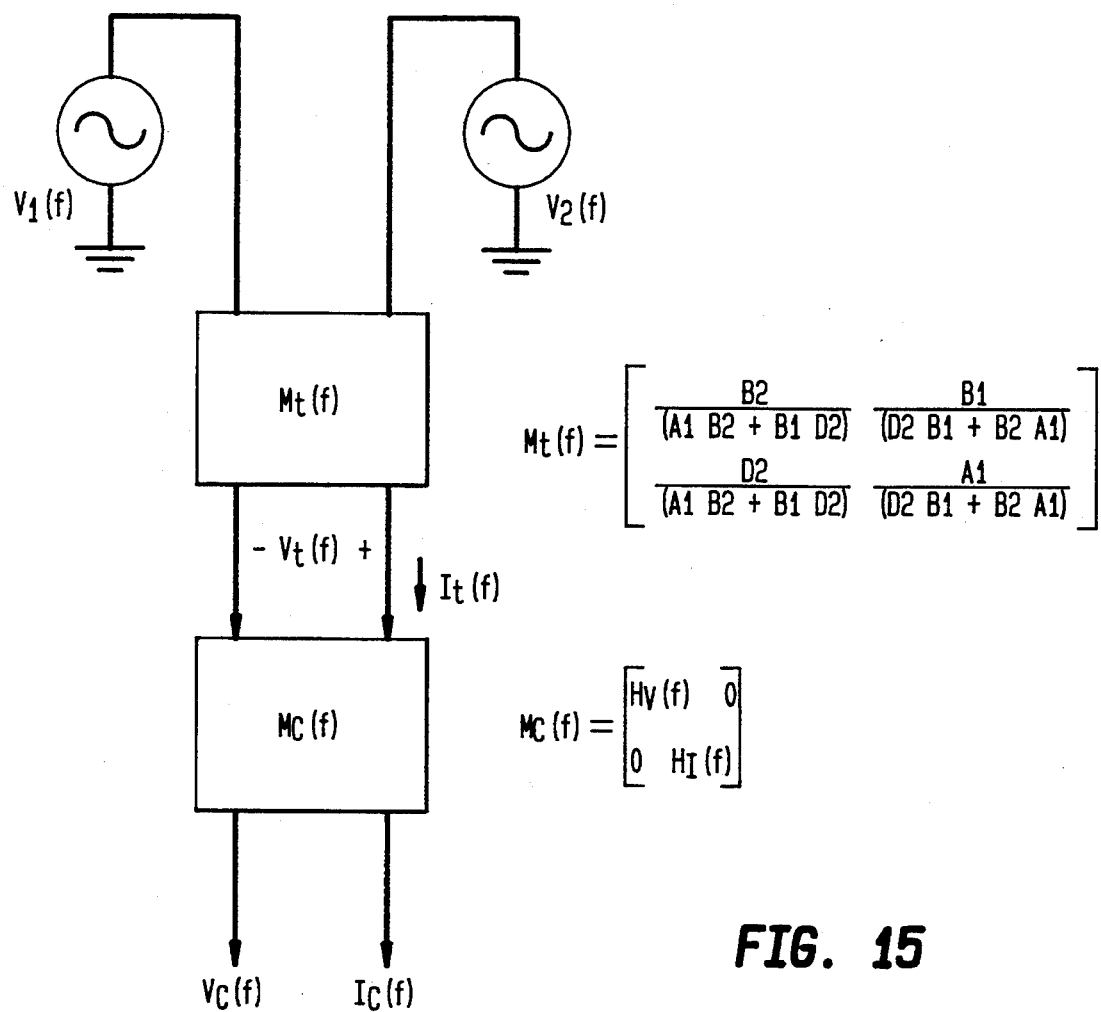
FIG. 15 diagrammatically illustrates a model for a directional signal separator.
Figure 16:
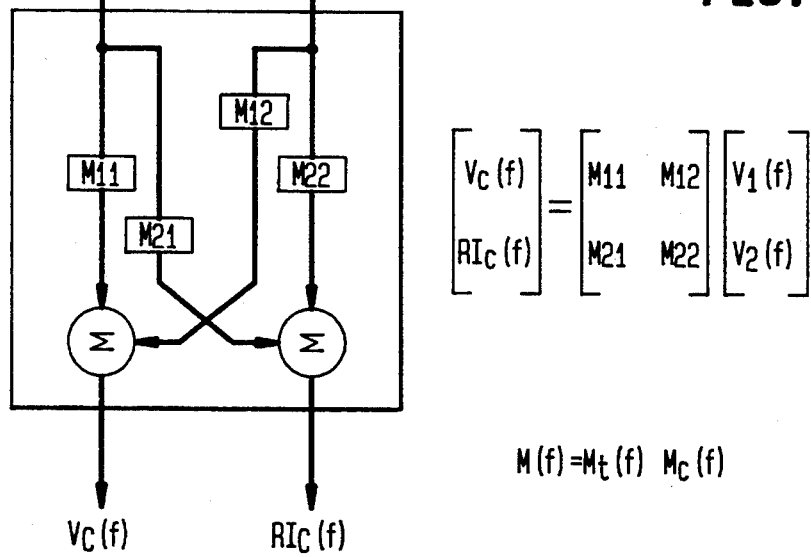
FIG. 16 illustrates matrices Mt and Mc cascaded to form a matrix M=Mt*Mc.

The voltage Vt(f) at voltage probe point 31 and the current It(f) at the current probe point 32 can be expressed in terms of the elements of the ABCD matrices 1 and 2. The model for the directional signal separator may then be redrawn as shown in FIG. 15. The matrices Mt and Mc may be cascaded to form a matrix M=Mt*Mc as illustrated in FIG. 16.

With the above definitions, the relationship between the current and voltage on the transmission line and the two desired output signals may be expressed as:

$$\begin{bmatrix} V_c(f) \\ RI_c(f) \end{bmatrix} = [M(f)] \begin{bmatrix} V_1(f) \\ V_2(f) \end{bmatrix}$$

This matrix relationship may be solved for the two driving source signals as:

$$\begin{bmatrix} V_1(f) \\ V_2(f) \end{bmatrix} = [M(f)]^{-1} \begin{bmatrix} V_c(f) \\ RI_c(f) \end{bmatrix}$$

where R is the termination resistance of the current probe 32.

The matrix W(f) and its elements that maps the output of the coupler (Vc(f) and RIc(f)) into the separated signals V1 and V2 may be defined as:

$$W(f) = [M(f)]^{-1} = \begin{bmatrix} W11(f) & W12(f) \\ W21(f) & W22(f) \end{bmatrix}$$

Figure 17:
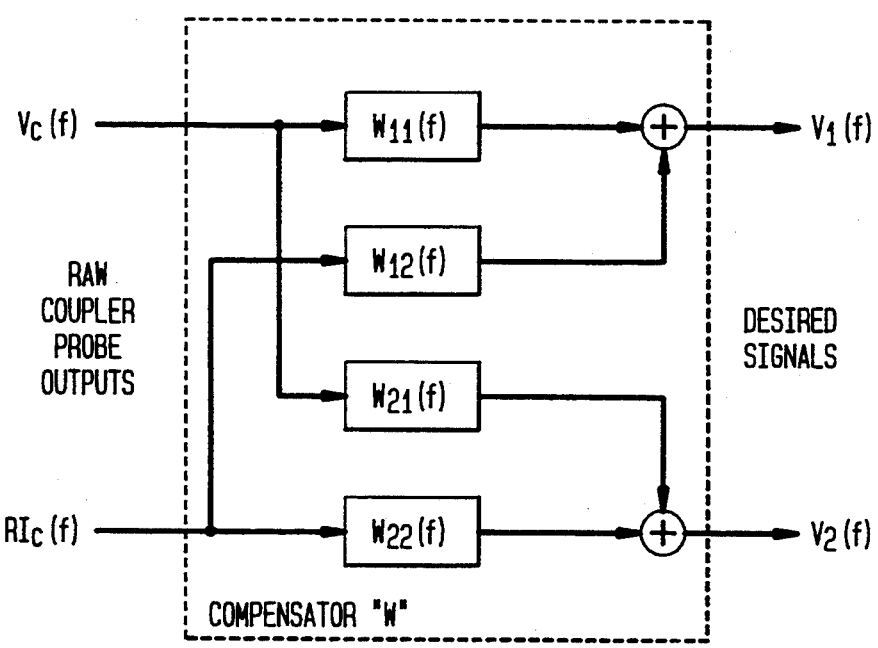
FIG. 17 diagrammatically illustrates an implementation of a signal compensating matrix W(f), which compensates for the distortions inherent in the voltage and currents probes plus transmission line impedance.
Figure 18:
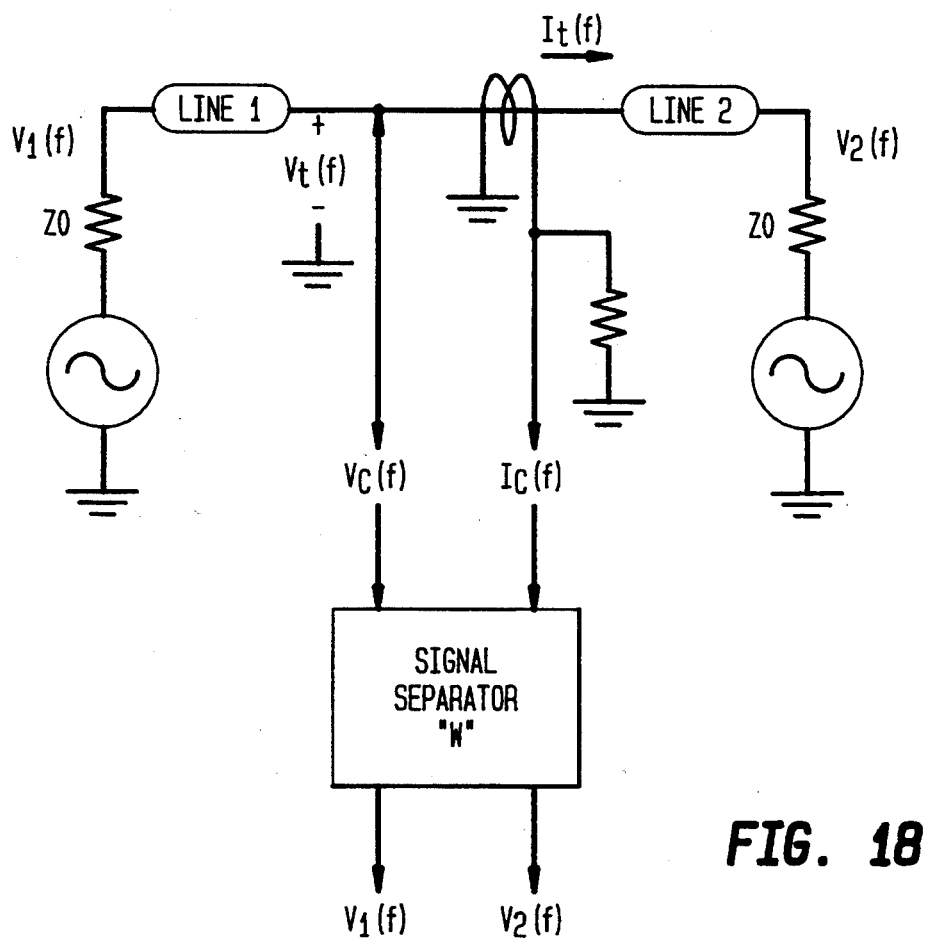
FIG. 18 schematically shows a compensated bi-directional coupler, depicting a directional signal separator 'W' coupled to a voltage probe and a current probe and producing outputs V1(f) and V2(f)

FIG. 17 diagrammatically illustrates an implementation of the signal compensating matrix W(f), which compensates for the distortions inherent in the voltage and currents probes plus the transmission line impedance. The resulting compensated bi-directional coupler is schematically shown in FIG. 18, which shows the directional signal separator 'W' coupled to voltage probe 31 and current probe 32 and producing outputs V1(f) and V2(f).

As pointed out previously, the compensation of the bi-directional coupler is effective at only one frequency. To accommodate multiple frequencies, consider performing the above described mechanism over multiple frequency bins and how a discrete Fourier transform may be implemented. Each of the frequency dependent entries in the compensating matrix W is a complex number. Conceptually, the values of these entries can be determined using an algorithm that sets either $V_1(f)$ or $V_2(f)$ to zero, while monitoring either $V_T(f)$ or $RI_T(f)$ to fill in the entries of the M matrix. This M matrix may then be inverted to produce the W matrix, as follows.

$$M_{11}(f) = V_T(f)/V_1(f): V_2(f) = 0$$

$$M_{12}(f) = V_T(f)/V_2(f): V_1(f) = 0$$

$$M_{21}(f) = RI_T(f)/V_1(f): V_2(f) = 0$$

$$M_{22}(f) = RI_T(f)/V_2(f): V_1(f) = 0$$

Since the object is not merely separating sinusoidal tones, but in separating and restoring time domain waveforms, the frequency response and/or the impulse response of the transmission line path should be known. For this purpose the frequency response can be measured in a manner consistent with a discrete Fourier transform. An inverse discrete Fourier transform (DFT) may then be defined and the impulse response derived.

It is well known that the DFT is given by $$H(n\Omega) = \sum_{k=0}^{N-1} h(kT) e^{-j\Omega Tnk}, n = 0, 1, \ldots, N-1$$

where h(kT) is the sampled impulse response $$h(kT) = h(0), h(T), \ldots, h([N-1]T)$$

and $\Omega = 2\pi/(NT)$. Likewise the IDFT is given as $$h(kT) = (1/N) \sum_{n=0}^{N-1} H(n\Omega) e^{j\Omega Tkn}.$$

It may be assumed that the sampling rate satisfies the well known Nyquist sampling theorem. In terms of sampling the frequency response, this means that since it has been assumed that the bandwidth of interest has been restricted to be less than Fupper, the number of frequency bins associated with the DFT will be no less than N≧2 Fupper, implying that T≦1/(2 Fupper).

The N frequency responses may then be measured in order to set the elements of the N M matrices at each of these frequencies. (That is, there will be N M matrices which will be denoted as M(n) where n=0,1, ..., N−1). The associated W(n) matrix at frequency intervals of Fupper/N may then be determined.

If it is assumed that the data link does not pass D.C. (as is often the case) then the first frequency bin of interest is at Fupper/N. All subsequent frequency response measurements may be referenced to this frequency. Proceeding for each of the frequency bins and for each of the elements of the M(n) matrix (the variable $\Omega$ is dropped in order to simplify notation) yields the desired inverse DFT relationships (where the notation has been again been simplified by dropping the variable T in the time domain argument). The subscript ij denotes the $ij^{th}$ element of the 2×3 matrix $[M(n)]^{-1}$.

$$h_{w11}(k) = (1/N) \sum_{n=0}^{N-1} [M(n)]_{11}^{-1} e^{j\Omega Tkn}$$

$$h_{w12}(k) = (1/N) \sum_{n=0}^{N-1} [M(n)]_{12}^{-1} e^{j\Omega Tkn}$$

$$h_{w21}(k) = (1/N) \sum_{n=0}^{N-1} [M(n)]_{21}^{-1} e^{j\Omega Tkn}$$

$$h_{w22}(k) = (1/N) \sum_{n=0}^{N-1} [M(n)]_{22}^{-1} e^{j\Omega Tkn}$$

Figure 19:
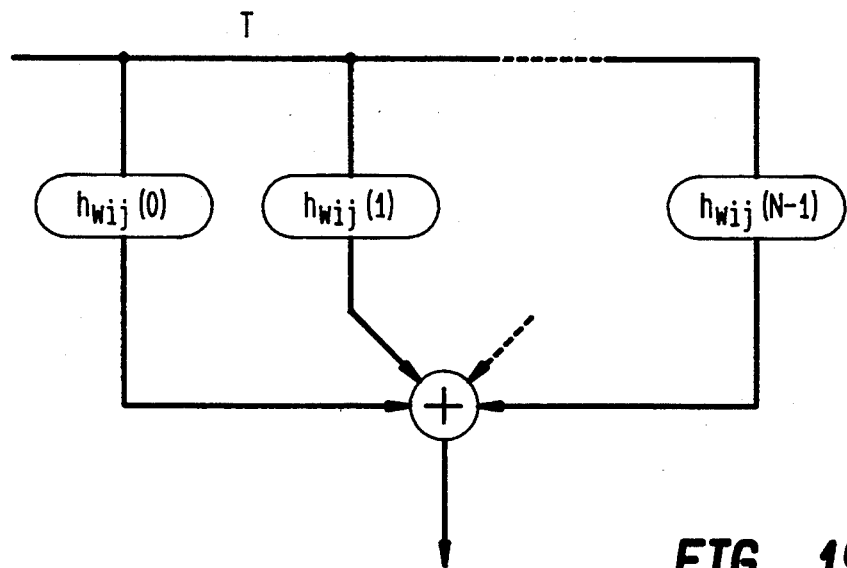
FIG. 19 diagrammatically illustrates the implementation of a compensation network W(k) as a finite impulse response (FIR) filter.

Thus, the compensation network W(k) may be implemented as a finite impulse response (FIR) filter diagrammatically illustrated in FIG. 19 having tap weights $h_{wij}(0), h_{wij}(1), \ldots, h_{wij}(N-1)$, given by the above equations. To implement W(k) requires four such filters, each filter having real valued tap weights. This implies that in the frequency domain, $H_{wij}(n)$ must have even magnitude and odd phase.

Figure 20:
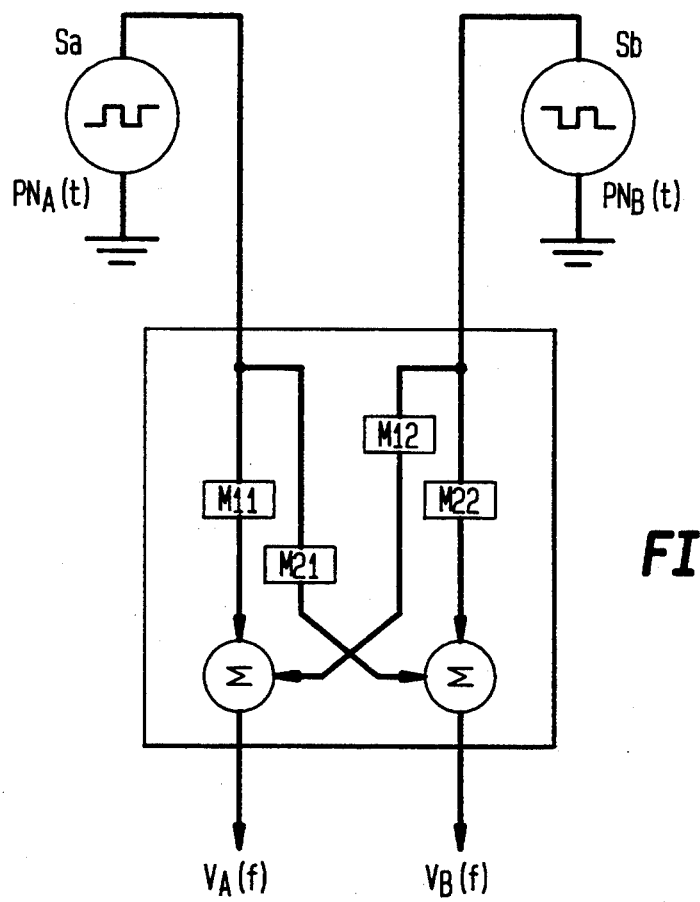
FIG. 20 diagrammatically shows weight values of a compensation network obtained directly in the time domain by inserting unique orthogonal pseudorandom sequences PN at each data port of a communication link.

The weight values of the compensation network may be obtained directly in the time domain by inserting unique orthogonal pseudorandom sequences PN at each data port Sa and Sb, as shown diagrammatically in FIG. 20.

Consider the convolution of the PN sequence $P_A(kT)$ with a filter h(kT) and the correlation of that convolutional product with the original PN sequence. (The only assumption is that $P_A(kT)$ correlated with itself is zero for all lags other than zero).

At the outset one can form $$f(j) = P_A(j) * h(j)$$

where * represents convolution and the argument T has been dropped to simplify notation. Next, f(j) is correlated with $P_A(j)$ for a given lag "1" to form the correlation product r(1).

$$r(l) = \sum_{j=0}^{N-1} P_A(j + 1) f_A(j), l = 0, 1, 2, \ldots, N-1$$

Figure 21:
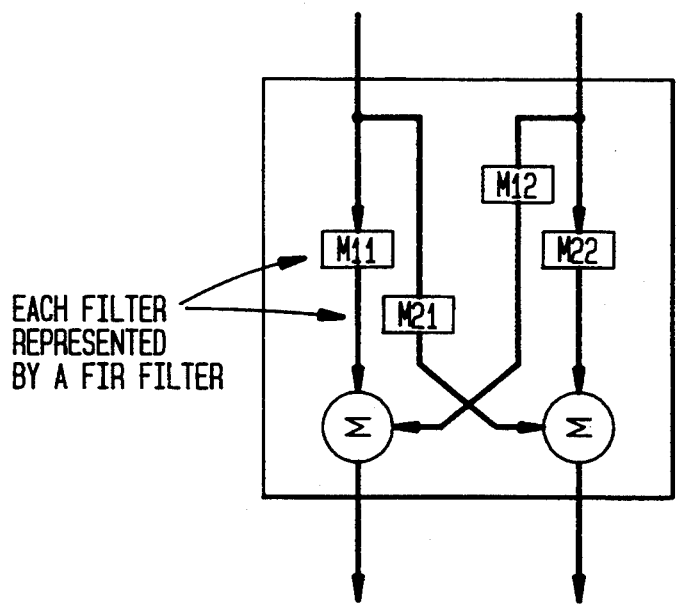
FIG. 21 diagrammatically illustrates a time domain M(k) matrix representation of channel distortion.

It may be readily demonstrated that the relationship between r(1) and h(k) is h(k)=r(1) for 1=k. In other words, the impulse response h(k) may be determined directly in the time domain without resorting to the frequency domain via the prudent use of a pseudorandom sequence. The analysis begins by considering the time domain M(k) matrix representation of the channel distortion, diagrammatically illustrated in FIG. 21. (It should be recalled that M is not an actual filter, only a representation of the channel distortion, including the effects of the current and voltage probes). The goal is to find the coefficients for each of the weights in the $M_{ij}$ filters, to be discussed below.

If two sufficiently long, orthogonal random sequences $P_A(k)$ and $P_B(k)$ are used as signal sources Sa and Sb respectively, then the elements of the M(k) matrix may be determined by performing the following correlations with lag parameter "k". It should be noted that because the pseudorandom sequences are orthogonal, that is, $$\sum_k P_A(K + 1) P_B(k) = 0$$

for all "1", two sequences can be applied simultaneously at each end of the data link without any mutual interference.

$$h_{M11}(k) = \sum_{j=0}^{N-1} P_A(j + k) V_A(j)$$

$$h_{M12}(k) = \sum_{j=0}^{N-1} P_B(j + k) V_A(j)$$

$$h_{M21}(k) = \sum_{j=0}^{N-1} P_A(j + k) V_B(j)$$

$$h_{M22}(k) = \sum_{j=0}^{N-1} P_B(j + k) V_B(j)$$

The DFT of the filter weights $\{h_{mij}\}$ is derived to solve for the components in the related single frequency, frequency domain representation of M(n). This matrix is then inverted to solve for the elements of the single frequency bin matrix W(n) matrices. The frequency response of the $W_{ij}(n)$ compensator is formed by taking the $ij^{th}$ element of the N W(n) matrices. The associated FIR filters with weights $H_{wij}(k)$ needed to implement the directional signal separator are then determined.

More specifically, the following steps are performed.

STEP 1: Find the tap weight coefficients of the FIR filters associated with the M matrix that represents the distorted channel impulse response. The weights for these filters are $h_{w11}(k)$, $h_{w12}(k)$, $h_{w21}(k)$, and $h_{w22}(k)$. These are found by correlating the channel response against the appropriate source PN sequence.

STEP 2: Execute a DFT on these four FIR filters which will provide four frequency responses, each comprised of N frequency samples (bins).

STEP 3: Construct N matrices—M(n) n=0,1, ..., N−1—for each frequency bin by selecting the appropriate frequency samples from each of the four filters comprising the channel model.

STEP 4: Invert each M(n) matrix; that is, $W(n) = [M(n)]^{-1}$.

STEP 5: Form the frequency response for each of the four FIR filters comprising the W compensator network by selecting the $W_{ij}(n)$ element from each of the W(n) n=0,1, ..., N−1 matrices.

STEP 6: Determine an inverse DFT to obtain the filter tap coefficients $h_{wij}(k)$ k=0,1, ..., N−1 for each of the four FIR filters that comprise the W compensator network.

To summarize this procedure, form $$M(n) = \begin{bmatrix} M_{11}(n) & M_{12}(n) \\ M_{21}(n) & M_{22}(n) \end{bmatrix}$$

where $$M_{ij}(n) = \sum_{k=0}^{N-1} h_{mij}(k) e^{-j\Omega T n k}$$

which can then be used to find the weight coefficients for the compensator filters that form the W matrix as $$h_{wij}(k) = (1/N) \sum_{n=0}^{N-1} [M(n)]_{ij}^{-1} e^{j\Omega T n k}.$$

The generation, synchronization and correlation of two pseudorandom sequences is well known and is common practice in the communications field. One technique that can closely synchronize the sequences is the use of accurate clocks located at both ends of the data link as well as at the tap point to generate timing epochs for use by the correlators.

Figure 22:
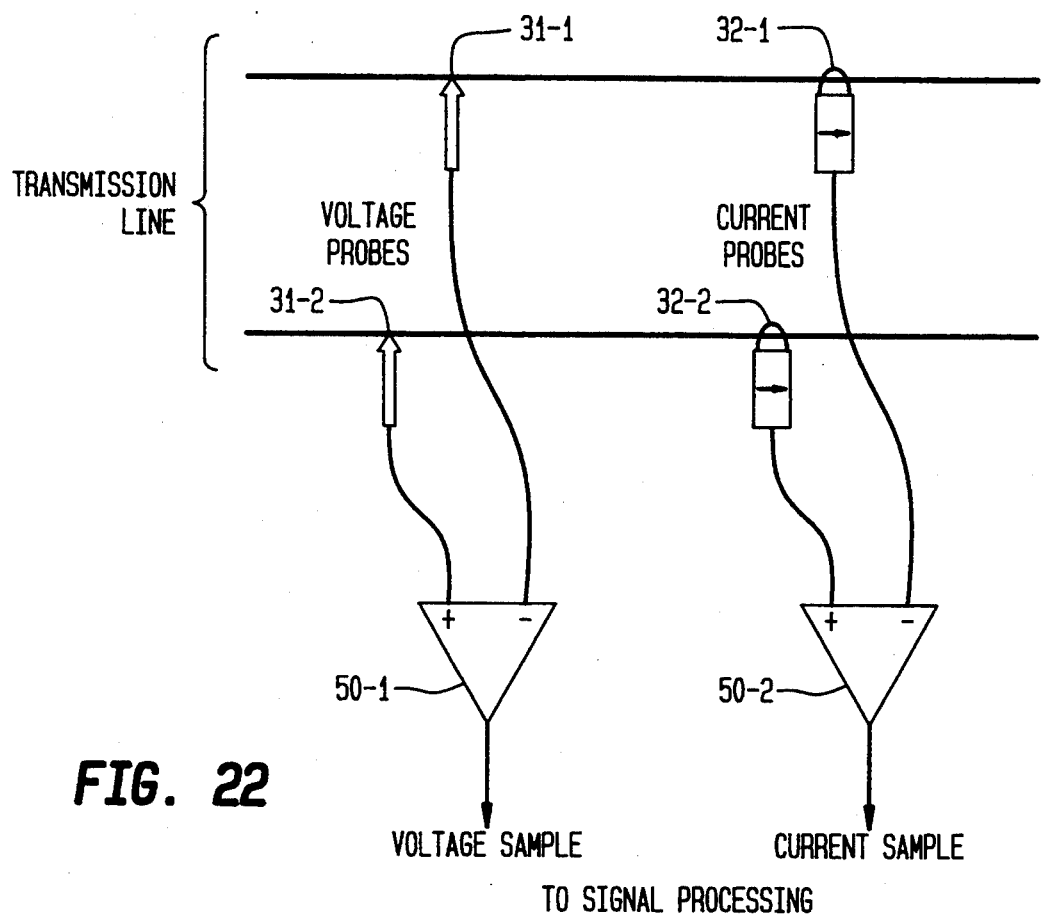
FIG. 22 diagrammatically illustrates an embodiment of a two-wire implementation of the present invention.

FIG. 22 diagrammatically illustrates an embodiment of a two-wire implementation of the present invention, comprised of respective pairs of voltage probes 31-1, 31-2 and current probes 32-1, 32-2, the outputs of which are coupled to respective differential amplifiers 50-1, 50-2. The differential amplifiers reject the common mode signal and amplify the differential mode signal, as required. The arrows A on the current probes show the relative polarity of the current probes and indicate that for a given direction of current flow, connecting the two probes according to the arrows with respect to the current flow, will yield the same polarity of output signal from each current.

As will be appreciated from the foregoing description, the disruption of ongoing communications in the course of attaching conventional signal monitoring equipment to a full-duplex communication line is effectively obviated in accordance with the present invention by means of a non-intrusive 'directional signal separator' that employs one or more pairs of voltage and current probe elements. The outputs of the probes of the directional signal separator are coupled to an associated signal processing mechanism that controllably combines the outputs of the probe pair to successfully extract and recover the respective signalling components.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinarily skill in the art.

What is claimed:

1. For use with a full duplex wireline communications link coupled between first and second transceiver stations, said first transceiver station being operative to transmit first digital communication signals to and receive second digital communication signals from said second transceiver station via said full duplex wireline communications link, and said second transceiver station being operative to transmit said second digital communication signals to and receive said first digital communication signals from said first transceiver station via said full duplex wireline communications link, a method of monitoring and extracting respective signal components of said first and second digital communication signals transmitted over said full duplex wireline communications link without disturbing voltage and current conditions of said full duplex wireline communications link, comprising the steps of:

(a) coupling, to said full duplex wireline communications link, without modifying the continuity of said full duplex wireline communications link, respective voltage and current monitoring probes that are operative to measure respective voltage and current characteristics of said digital communication signals transmitted over said link without disturbing the transmission of said first and second digital communication signals over said link; and (b) combining outputs of said voltage and current monitoring probes in accordance with a prescribed signal processing mechanism which provides first and second output signals respectively representative of said first and second digital communication signals.

2. The method according to claim 1, wherein said full duplex wireline communications link comprises a two wire balanced transmission line, and wherein step (a) further comprises the steps of coupling individual ones of respective pairs of voltage and current probes to respective portions of said two wire balanced transmission line, and coupling a first differential amplifier to outputs of said pair of voltage probes and a second differential amplifier to outputs of said pair of current probes, said first and second differential amplifiers being operative to extract a differential mode signal and to reject a common mode signal.

3. The method according to claim 1, wherein said prescribed signal processing mechanism is operative to adjust the characteristic impedance of said voltage and current probes so as to compensate for the impedance characteristics of said communication link.

4. The method according to claim 1, wherein said prescribed signal processing mechanism is operative to adjust the characteristic impedance of said voltage and current probes so as to provide analog compensation.

5. For use with a full duplex wireline communications link coupled between first and second transceiver stations, said first transceiver station being operative to transmit first digital communication signals to and receive second digital communication signals from said second transceiver station via said full duplex wireline communications link, and said second transceiver station being operative to transmit said second digital communication signals to and receive said first digital communication signals from said first transceiver station via said full duplex wireline communications link, an apparatus for monitoring and extracting respective signal components of said first and second digital communication signals transmitted over said full duplex wireline communications link without disturbing voltage and current conditions of said full duplex wireline communications link, comprising:

respective voltage and current monitoring probes coupled to said full duplex wireline communications link without modification of said full duplex wireline communications link, and being operative to measure respective voltage and current characteristics of said digital communication signals transmitted over said link without disturbing the transmission of said first and second digital communication signals over said link; and a signal processor, coupled to receive signals provided by said respective voltage and current monitoring probes and being operative to combine said provided signals in accordance with a prescribed signal processing mechanism which produces first and second output signals respectively representative of said first and second digital communication signals.

6. The apparatus according to claim 5, wherein said full duplex wireline communications link comprises a two wire balanced transmission line, and wherein individual ones of respective pairs of voltage and current probes are coupled to respective portions of said two wire balanced transmission line, and further including a first differential amplifier coupled to outputs of said pair of voltage probes and a second differential amplifier coupled to outputs of said pair of current probes, said first and second differential amplifiers being operative to extract a differential mode signal and to reject a common mode signal.

7. The apparatus according to claim 5, wherein said signal processor is operative to adjust the characteristic impedance of said voltage and current probes so as to compensate for the impedance characteristics of said communication link.

8. The apparatus according to claim 5, wherein said signal processor is operative to adjust the characteristic impedance of said voltage and current probes so as to provide analog compensation.

9. For use with a full duplex wireline communications link coupled between first and second transceiver stations, said first transceiver station being operative to transmit first digital communication signals to and receive second digital communication signals from said second transceiver station via said full duplex wireline communications link, and said second transceiver station being operative to transmit said second digital communication signals to and receive said first digital communication signals from said first transceiver station via said full duplex wireline communications link, a method of monitoring and extracting respective signal components of said first and second digital communication signals transmitted over said full duplex wireline communications link without disturbing voltage and current conditions of said full duplex wireline communications link, comprising the steps of:

(a) coupling, to said full duplex wireline communications link, without insertion of one or more electrical circuit components into said communications link not otherwise required for the transmission of digital communication signals thereover between said first and second transceiver stations, or otherwise modifying the continuity of said full duplex wireline communications link, respective voltage and current monitoring probes that are operative to measure respective voltage and current characteristics of said digital communication signals transmitted over said link without affecting characteristics of said first and second digital communication signals being transmitted over said link; and (b) combining outputs of said voltage and current monitoring probes by means of a prescribed signal processing mechanism which provides a first output signal representative of said first digital communication signals, exclusive of said second digital communication signals, and a second output signal representative of said second digital communication signals, exclusive of said first digital communication signals, thereby extracting individual ones of said first and second digital communication signals.

10. The method according to claim 9, wherein said full duplex wireline communications link comprises a two wire balanced transmission line, and wherein step (a) further comprises the steps of coupling individual ones of respective pairs of voltage and current probes to respective portions of said two wire balanced transmission line, and coupling a first differential amplifier to outputs of said pair of voltage probes and a second differential amplifier to outputs of said pair of current probes, said first and second differential amplifiers being operative to extract a differential mode signal and to reject a common mode signal.

11. A method of monitoring and extracting respective unidirectional signal components transmitted on a full duplex two-wire balanced transmission line, comprising the steps of:

(a) providing a bidirectional signal separator, which is capable of monitoring said two wire balance transmission line and extracting therefrom respective voltage and current signals representative of said unidirectional signal components, said bidirectional signal separator having respective pairs of voltage and current probes, individual ones of which are coupled to respective portions of said two-wire balanced transmission line, and respective differential amplifiers, a first of which is coupled to the outputs of said current probes and a second of which is coupled to the outputs of said voltage probes, each of said differential amplifiers being operative to extract a differential mode signal and to reject a common mode signal; and (b) coupling said bidirectional signal separator to said two wire balanced transmission line without interrupting said two wire balanced transmission line and placing said bidirectional signal separator in operation so that it provides said respective unidirectional signal components.

12. A device for monitoring and extracting respective unidirectional signal components transmitted on a full duplex two wire balance transmission line, comprising:
a bidirectional signal separator monitoring device that is capable of monitoring said two wire balanced transmission line and providing respective output signals representative of said respective unidirectional signal components, said bidirectional signal separator extracting respective voltage and current signals representative of said unidirectional signal components and comprising respective pairs of voltage and current probes, individual ones of which are coupled to respective portions of said two wire balanced transmission line, and respective differential amplifiers, a first of which is coupled to the outputs of the voltage probes and a second of which is coupled to the outputs of said current probes, each of said differential amplifiers being operative to extract a differential mode signal and to reject a common mode signal; and
an interface for coupling said bidirectional signal separator device to said two wire balanced transmission line without interrupting said two wire balanced transmission line, so that said bidirectional signal separator device is operative to provide said respective unidirectional signal components.

* * * * *